US005216393A

United States Patent [19]

Wandel

[11] Patent Number: 5,216,393

[45] Date of Patent: Jun. 1, 1993

[54] HIGH FREQUENCY BROADBAND TV SIGNAL TRANSFORMER, ESPECIALLY FOR 47-860 MHZ BAND

[75] Inventor: Peter Wandel, Berlin, Fed. Rep. of Germany

[73] Assignee: Robert Bosch GmbH, Stuttgart, Fed. Rep. of Germany

[21] Appl. No.: 822,995

[22] Filed: Jan. 21, 1992

[30] Foreign Application Priority Data

Feb. 2, 1991 [DE] Fed. Rep. of Germany ....... 4103184

[51] Int. Cl.[5] ............................................ H03H 7/38

[52] U.S. Cl. .......................................... 333/32; 336/188

[58] Field of Search .................. 333/25, 32, 119, 131; 336/170, 180, 188

[56] References Cited

U.S. PATENT DOCUMENTS

| | | | |
|---|---|---|---|
| 4,201,962 | 5/1980 | Hosoga | 333/32 X |
| 4,379,273 | 4/1983 | Bender | 333/32 |
| 4,687,947 | 8/1987 | Cobb | 336/180 X |
| 5,051,710 | 9/1991 | Kaltenecker | 333/32 |

OTHER PUBLICATIONS

John Watkinson, *The Art of Digital Video*, pp. 243-244, 328-330, Focal Press, Stoneham, Mass., 1990, ISBN 0-240-51287-1.

Peter Wandel, "Simplified Combination Laser Diode Protective Circuit," corresponding to DE-OS 40 31 066.3 (U.S. Ser. No. 07/766002 filed Sep. 26, 1991).

*Primary Examiner*—Paul Gensler

*Attorney, Agent, or Firm*—Frishauf, Holtz, Goodman & Woodward

[57] ABSTRACT

Conventional transformers for coupling a transmission line to a laser diode have an upper frequency limit of about 600 MHz. In order to extend bandwidth up to 860 MHz, an improved transformer features a first winding W1 and a second winding W2 twisted together and wrapped through apertures L1 and L2 of a double-aperture ferrite core DK. The twisting together of the windings suppresses stray inductances which would otherwise limit bandwidth. Preferably, a first grounding C1 is connected to the input terminal E and a second grounding capacitor C2 is connected to the output terminal O. Further, at the output terminal O, a laser diode LD is connected. The improved structure will perform anywhere within a bandwidth from 47 MHz up through 860 MHz.

4 Claims, 1 Drawing Sheet

HIGH FREQUENCY BROADBAND TV SIGNAL TRANSFORMER, ESPECIALLY FOR 47-860 MHZ BAND

Cross-reference to related patent applications, assigned to the assignee of the present invention, the disclosures of which are hereby incorporated by reference: U.S. Ser. No. 07/766,022, Peter WANDEL, filed 26 Sep. 1991.

FIELD OF THE INVENTION

The present invention relates generally to an optical TV transmission by means of an analogue-modulated lager diode, and more particularly, to an improved transformer structure which extends transmission capability up to 860 MHz.

BACKGROUND

It is known to connect a transmission line with a laser diode via a transformer, but such transformer is adapted for transmission only up to about 600 MHz.

It is further known, for transmission of high frequencies up to about 860 MHz, to substitute a resistance instead of a coil or winding. However, this results in a damping of 4 dB which must be compensated for by about a 4 dB increase in high frequency power. Unfortunately, such higher power is associated with signal quality problems.

THE INVENTION

Accordingly, it is a primary object of the present invention to provide a dual-winding transformer which is adapted for transmission in the frequency range above 600 MHz, while retaining the simplest, most compact possible structure.

Briefly, this is accomplished by providing a first winding connected between the transformer input and output terminals, and a second winding connected between the output terminal and ground, and forming a twisted pair of the two windings before wrapping them onto the core, which is preferably a double-aperture core. Such a structure will transmit signals anywhere within a frequency range of 47 MHz to 860 MHz. Serial stray inductances, which would otherwise occur and have a strongly bandwidth-limiting effect, are compensated or avoided by the twisting together of the fist and second windings. The broad bandwidth is retained, even if the respective winding ratios of the first and second windings are not identical, but rather are different.

Further, another desirable feature is to connect a grounding capacitor to the input terminal or the output terminal, or to each terminal, of the high frequency broadband transformer. This compensates for any parasitic inductive components which may be present in the transformer, thereby increasing the bandwidth.

DRAWINGS

DETAILED DESCRIPTION

Figure 1:
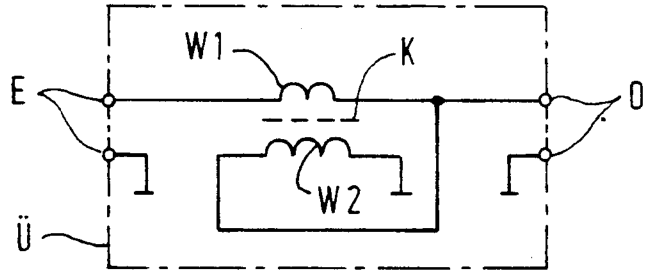
FIG. 1 is a schematic circuit diagram of a high frequency broadband transformer.

FIG. 1 is a schematic diagram of a high frequency broadband transformer U having an input terminal E, an output terminal O, and two windings W1 and W2 arranged on a ferrite core K. Signal generation and modulation components may be of any suitable conventional construction, and are therefore omitted here for simplicity, since they are not necessary to an understanding of the present invention.

Figure 2:
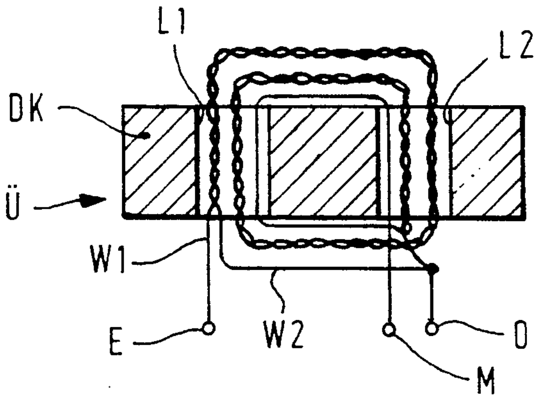
FIG. 2 is a sectional view of a double-aperture ferrite core with a twisted pair of windings W1, W2 and their terminals indicated schematically thereon.

FIG. 2 illustrates, in section, a double-aperture ferrite core with two apertures L1 and L2. As indicated schematically, windings W1 and W2 are twisted together and wound through apertures L1 and L2. In the example presented, first winding W1 has two turns, and second winding W2 has three turns. Both windings W1 and W2 preferably consist essentially of coated copper wire. Input, ground, and output terminals are designated respectively E, M, and O.

Figure 3:
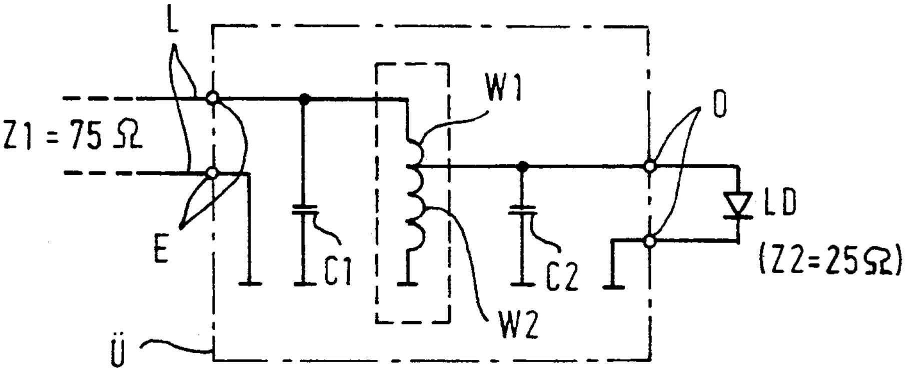
FIG. 3 is a schematic diagram of a high frequency broadband transformer incorporating a laser diode.

As shown in FIG. 3, input terminals E of a high frequency broadband transformer are connected to a high frequency lead L, which has an impedance of, for example, 75 ohms. The transformer has generally the same structure as that of FIG. 2, with the addition of a grounding capacitor C1 connected between the input and W1 of the primary side, and a grounding capacitor C2 connected on the secondary side, adjacent output terminal O. As output terminal O, a laser diode LD is connected, having an impedance Z2 of, for example, 25 ohms. Capacitors C1 and C2 effect a compensation of any parasitic inductances within transformer U. Windings W1 and W2 preferably have a winding ratio of 1:3.

Various changes and modifications are possible within the scope of the inventive concept.

I claim:

1. A circuit for broadband coupling of a television signal on a lead (L) having a first impedance (Z1) to a laser diode (LD), having a second and lower impedance (Z2), used for optical further transmission of said television signal, comprising
   - a pair of input terminals (E) connected to said lead (L);
   - a first capacitor (C1) connected between ground and a non-grounded one of said input terminals (E);
   - a high frequency broadband transformer having two windings (W1,W2) on a single ferrite core (K),
   - a first one (W1) of said windings being connected between said non-grounded input terminal (E) and a transformer output terminal (O), and a second one (W2) of said windings being connected between said transformer output terminal (O) and ground (M), said output terminal being adapted for connection to an input of said laser diode (LD), and
   - a second capacitor (C2) connected between said transformer output terminal (O) and ground,
   - said first and second windings forming a twisted pair (W1,W2) commonly wound around said ferrite core (K), said transformer and said capacitors together serving to suppress serial stray inductances, thereby transmitted signals to said laser diode (LD) at frequencies up to about 860 MHz.

2. A circuit according to claim 1,
   wherein said windings (W1,W2) consist essentially of coated copper wire.

3. A transformer according to claim 1,
   wherein said ferrite core is a double-aperture core (DK).

4. A circuit according to claim 3,
   wherein said windings (W1, W2) consist essentially of coated copper wire.

* * * * *